United States Patent
Goldblatt

(10) Patent No.: US 10,298,187 B2
(45) Date of Patent: May 21, 2019

(54) SELECTIVE HIGH AND LOW POWER AMPLIFIER SWITCH ARCHITECTURE

(71) Applicant: QUALCOMM Incorporated, San Diego, CA (US)

(72) Inventor: Jeremy Goldblatt, Encinitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 23 days.

(21) Appl. No.: 15/235,521

(22) Filed: Aug. 12, 2016

(65) Prior Publication Data

US 2018/0048273 A1    Feb. 15, 2018

(51) Int. Cl.
*H03F 1/14*    (2006.01)
*H03F 3/21*    (2006.01)
(Continued)

(52) U.S. Cl.
CPC .......... *H03F 3/211* (2013.01); *H03F 1/0277* (2013.01); *H03F 3/195* (2013.01); *H03F 3/213* (2013.01); *H03F 3/602* (2013.01); *H03F 3/72* (2013.01); *H03K 17/693* (2013.01); *H03F 2200/396* (2013.01); *H03F 2200/414* (2013.01); *H03F 2200/417* (2013.01); *H03F 2200/421* (2013.01); *H03F 2200/426* (2013.01); *H03F 2200/432* (2013.01); *H03F 2200/451* (2013.01); *H03F 2200/513* (2013.01); *H03F 2203/21175* (2013.01); *H03F 2203/7221* (2013.01); *H03F 2203/7224* (2013.01);
(Continued)

(58) Field of Classification Search
CPC .......... H03F 1/0288; H03F 1/07; H03F 3/211; H03F 3/602; H03F 1/0277; H03F 3/72; H03G 1/0088

USPC .......................................................... 330/51
See application file for complete search history.

(56) References Cited

U.S. PATENT DOCUMENTS

| 4,598,252 A * | 7/1986 | Andricos | H03F 3/72 330/51 |
| 6,385,464 B1 * | 5/2002 | Narita | H04B 7/0602 455/561 |

(Continued)

OTHER PUBLICATIONS

Cho Y., et al., "A Dual Power-Mode Multi-Band Power Amplifier with Envelope Tracking for Handset Applications", IEEE Transactions on Microwave Theory and Techniques, vol. 61, No. 4, Apr. 2013, pp. 1608-1619.
(Continued)

*Primary Examiner* — Khanh V Nguyen
(74) *Attorney, Agent, or Firm* — Patterson & Sheridan, L.L.P.

(57) ABSTRACT

Certain aspects of the present disclosure provide a switch architecture for switching between a low power amplifier and a high power amplifier. One example amplification system includes a high power amplifier and a low power amplifier. The amplification system further includes a first switch coupled between the high power amplifier and an output. The amplification system further includes a second switch coupled between the output and a reference potential. The second switch is further coupled between the low power amplifier and the output and configured to selectively couple the low power amplifier to the output. The amplification system further includes a third switch coupled between the low power amplifier and the second switch.

15 Claims, 8 Drawing Sheets

(51) Int. Cl.
    *H03F 3/195*     (2006.01)
    *H03F 3/213*     (2006.01)
    *H03F 1/02*     (2006.01)
    *H03F 3/60*     (2006.01)
    *H03F 3/72*     (2006.01)
    *H03K 17/693*     (2006.01)
    *H04B 1/04*     (2006.01)
    *H04B 1/16*     (2006.01)

(52) U.S. Cl.
    CPC ............. *H03F 2203/7236* (2013.01); *H03F 2203/7239* (2013.01); *H04B 1/04* (2013.01); *H04B 1/16* (2013.01)

(56) References Cited

U.S. PATENT DOCUMENTS

| | | | |
|---|---|---|---|
| 7,427,894 B2 | 9/2008 | Dow et al. | |
| 7,443,236 B2 | 10/2008 | Dow et al. | |
| 8,710,927 B2* | 4/2014 | Kamitani | H03F 1/0277 330/51 |
| 8,718,582 B2* | 5/2014 | See | H03F 1/0244 330/278 |
| 8,981,849 B2 | 3/2015 | Song | |
| 2005/0079829 A1 | 4/2005 | Ogawa et al. | |
| 2008/0079653 A1 | 4/2008 | Ahn et al. | |
| 2011/0275336 A1 | 11/2011 | Rofougaran | |

OTHER PUBLICATIONS

Kim B., et al., "A Dual-Mode Power Amplifier with on-Chip Switch Bias Control Circuits for LTE Handsets", IEEE Transactions on Circuits and Systems—II: Express Briefs, vol. 58, No. 12, Dec. 2011, pp. 857-861.

International Search Report and Written Opinion—PCT/US2017/040533—ISA/EPO—dated Sep. 1, 2017.

Lee K-H., et al., "High Linearity SPDT Switch for Dual Band Wireless LAN Applications", Microwave Conference Proceedings, APMC 2005, Dec. 4, 2005, vol. 2, XP010901961, DOI: 10.1109/APMC.2005.1606461, ISBN: 978-0-7803-9433-9, pp. 1-4.

Wang X.S., et al., "A Smartphone SP10T T/R Switch in 180-nm SOI CMOS with 8kV+ ESD Protection by Co-design", Proceedings of the IEEE Custom Integrated Circuits Conference, Sep. 22, 2013, XP032524635, DOI: 10.1109/CICC.2013.6658474, [retrieved on Nov. 7, 2013], pp. 1-4.

\* cited by examiner

SELECTIVE HIGH AND LOW POWER AMPLIFIER SWITCH ARCHITECTURE

TECHNICAL FIELD

Certain aspects of the present disclosure generally relate to electronic circuits and, more particularly, to a switch architecture for switching between a low power amplifier and a high power amplifier.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology), 4G, 5G, or later system, which may provide network service via any one of various radio access technologies (RATs) including EVDO (Evolution-Data Optimized), 1xRTT (1 times Radio Transmission Technology, or simply 1x), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks. Other examples of wireless communication networks may include WiFi (in accordance with IEEE 802.11), WiMAX (in accordance with IEEE 802.16), and Bluetooth® networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

In order to transmit data and/or control information, the radio frequency front end of the base station and/or the mobile station may generate and transmit radio frequency (RF) signals. One or more power amplifiers (PAs) may amplify these RF signals. In some cases, both high power amplification and low power amplification may be used. For example, the base station and/or the mobile station may switch between a low power mode for amplifying an RF signal and a high power mode for amplifying an RF signal, depending on the level of amplification needed to amplify the signal for transmission (e.g., via an antenna). Accordingly, the base station and/or the mobile station may include a low power amplifier and a high power amplifier to amplify the RF signals.

SUMMARY

Certain aspects of the present disclosure generally relate to a switching architecture for selectively switching between a low power amplifier and a high power amplifier.

Certain aspects of the present disclosure provide an amplification system. The amplification system generally includes a high power amplifier and a low power amplifier. The amplification system further includes a first switch coupled between the high power amplifier and an output. The amplification system further includes a second switch coupled between the output and a reference potential. The second switch is further coupled between the low power amplifier and the output and configured to selectively couple the low power amplifier to the output. The amplification system further includes a third switch coupled between the low power amplifier and the second switch.

Certain aspects of the present disclosure provide an amplification system. The amplification system generally includes a high power amplifier and a low power amplifier. The amplification system further includes a first transistor coupled between the high power amplifier and an output. The amplification system further includes a second transistor. The amplification system further includes a third transistor. The second transistor is coupled between the output and the third transistor. The third transistor is coupled between the second transistor and a reference potential. The amplification system further includes a fourth transistor coupled between the low power amplifier and a node between the second transistor and the third transistor.

Certain aspects of the present disclosure provide a method of selectively coupling an output to a high power amplifier and a low power amplifier. The method generally includes using a first control signal to control operation of a first transistor. The first transistor is coupled between the high power amplifier and the output. The method further includes using a second control signal and a third control signal to control operation of a second transistor. The method further includes using the second control signal to control operation of a third transistor. The second transistor is coupled between the output and the third transistor. The third transistor is coupled between the second transistor and a reference potential. The method further includes using the third control signal to control operation of a fourth transistor. The fourth transistor is coupled between the low power amplifier and a node between the second transistor and the third transistor.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
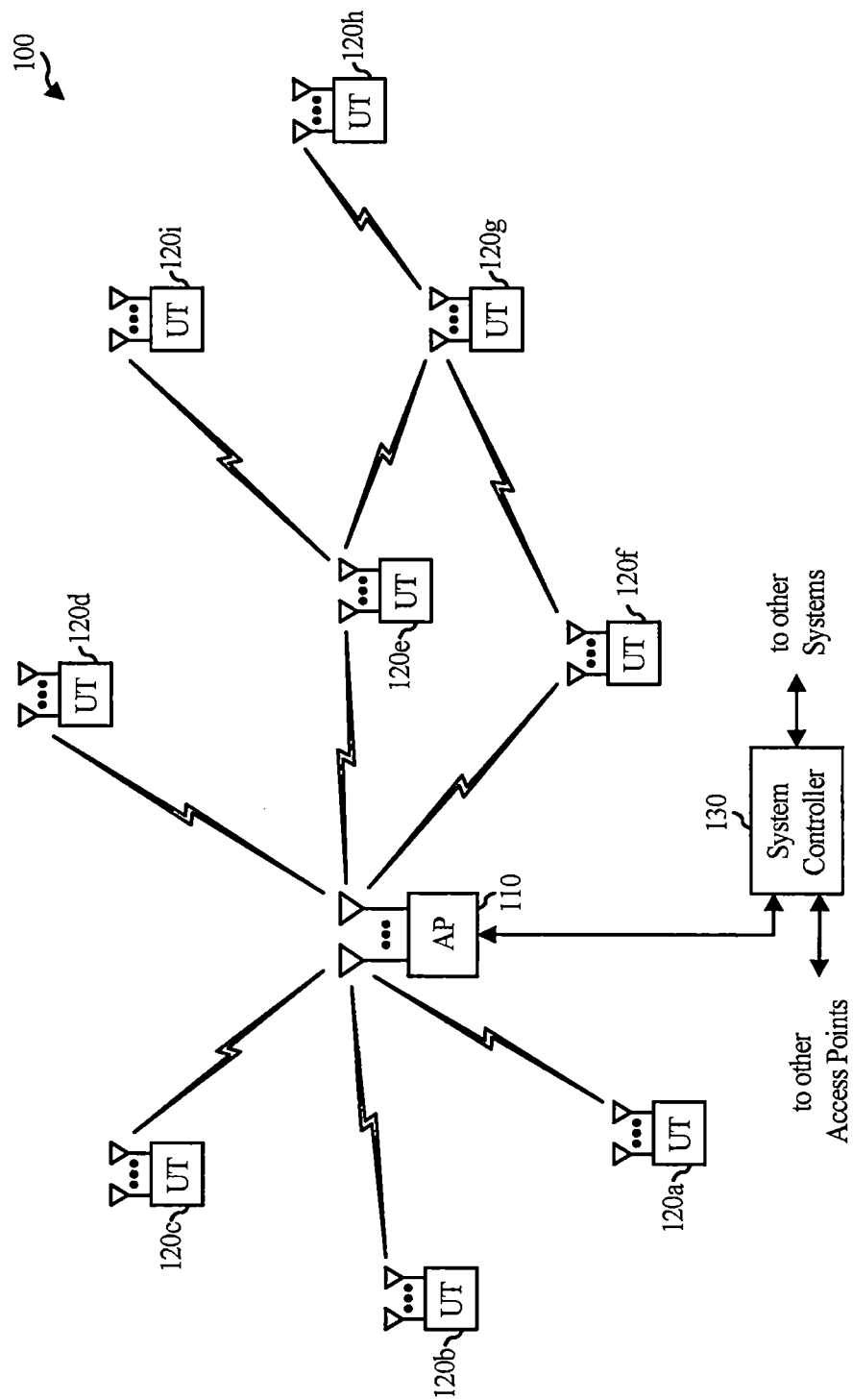
FIG. 1 is a diagram of an example wireless communications network, in accordance with certain aspects of the present disclosure.

FIG. 1 illustrates a wireless communications system 100 with access points 110 and user terminals 120. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include one or more power amplifiers (e.g., high power amplifiers and low power amplifiers) for selectively amplifying signals transmitted on antennas. The access point 110 and/or user terminal 120 may further utilize a switching architecture to selectively couple the antennas to the one or more power amplifiers, in accordance with certain aspects of this disclosure.

Figure 2:
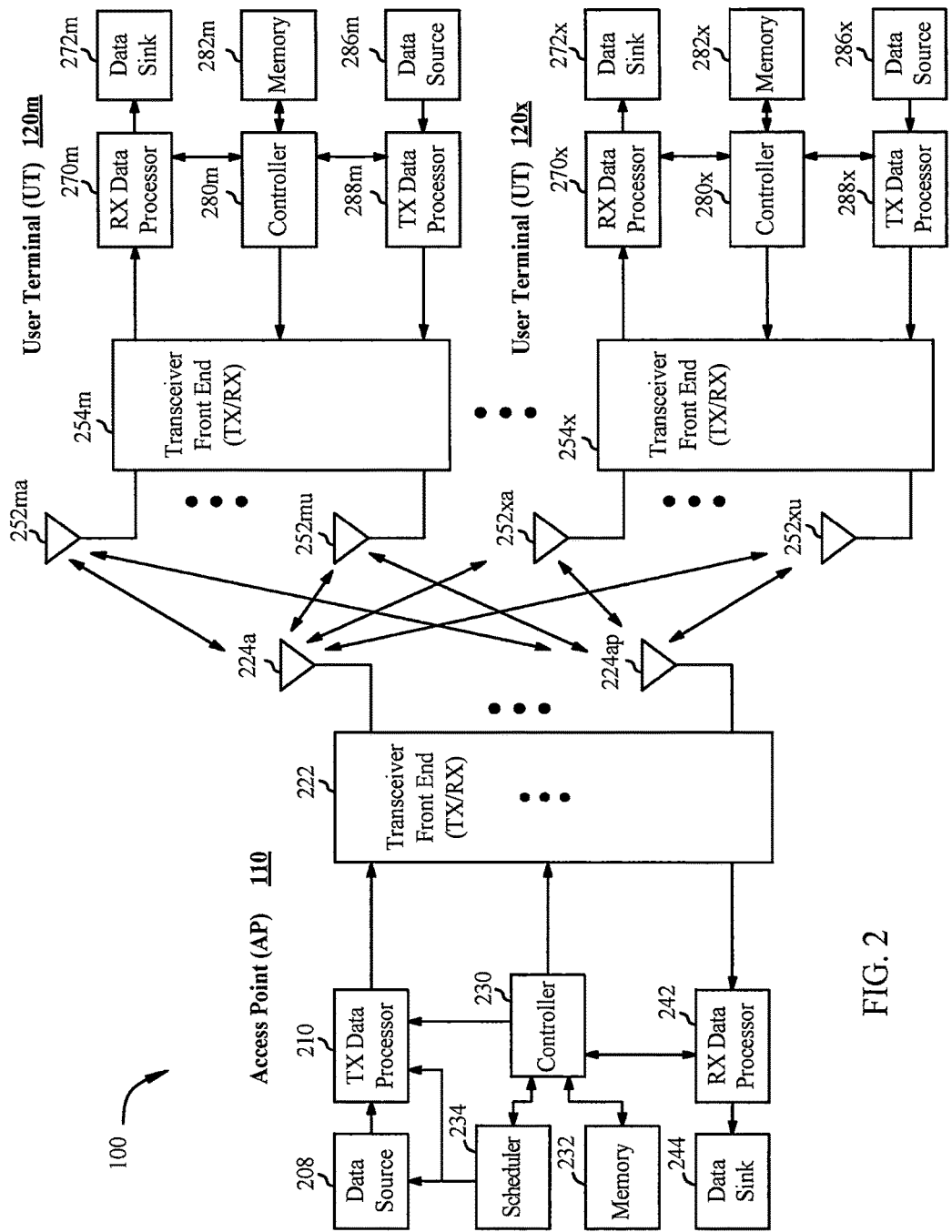
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$, antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may include one or more power amplifiers (e.g., high power amplifiers and low power amplifiers) for selectively amplifying signals transmitted on antennas. The transceiver front end 222 and/or the transceiver front end 254 may further utilize a switching architecture to selectively couple the antennas to the one or more power amplifiers, in accordance with certain aspects of this disclosure.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol stream for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
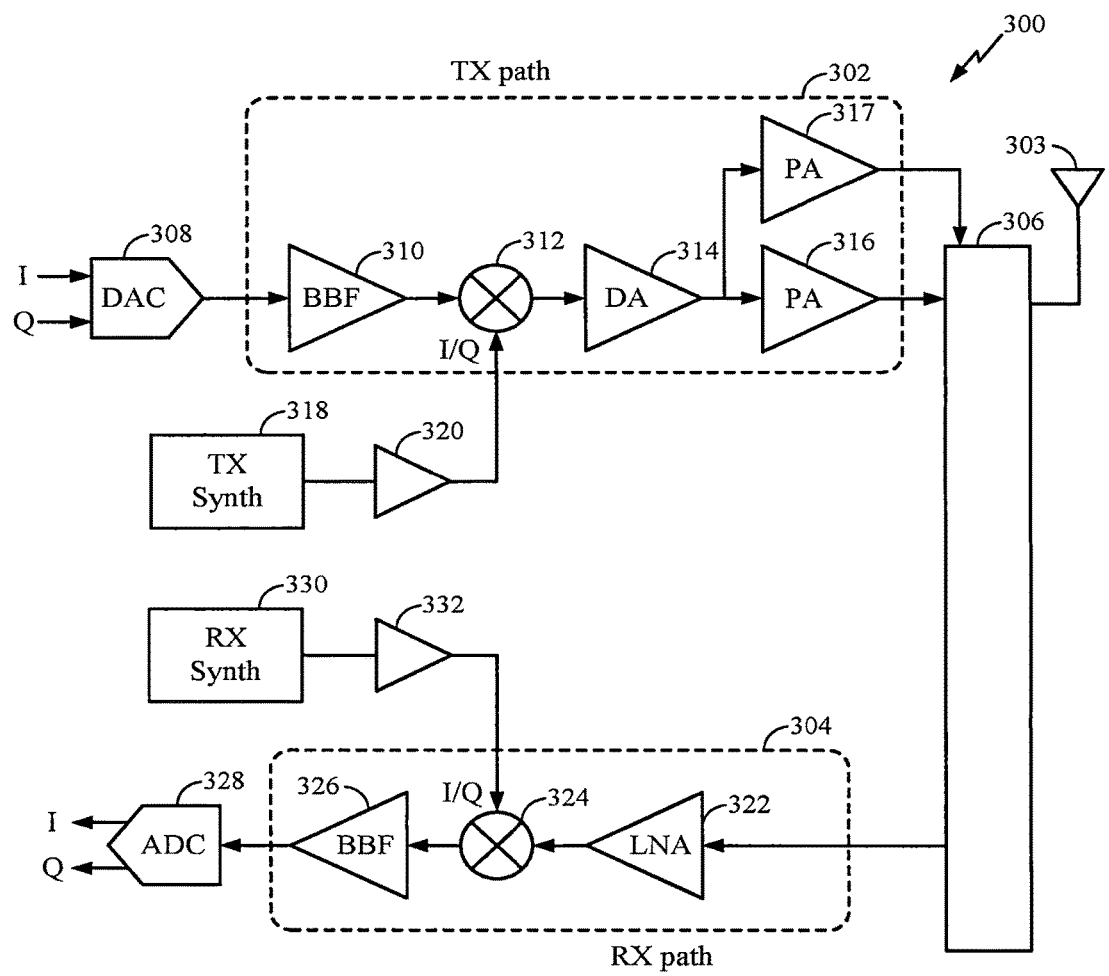
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, a power amplifier (PA) 316 (e.g., a high power amplifier), and a PA 317 (e.g., a low power amplifier). The BBF 310, the mixer 312, and the DA 314 may be included in a radio frequency integrated circuit (RFIC), while the PAs 316 and 317 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PAs 316 or 317 before transmission by the antenna 303. In particular, the interface 306 may include a switching architecture to selectively couple one or more antennas 303 to the PA 316 or PA 317, in accordance with certain aspects of this disclosure.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO)

signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a VCO to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324.

Example Amplifier Switching Architecture

Communication devices (e.g., mobile phones, WiFi devices, access points, user terminals, etc.) may be configured to operate in different power modes for different circumstances. For example, a communication device may operate in a low power mode or a high power mode. In some aspects, the communication device includes both a high power amplifier and a low power amplifier to amplify signals (e.g., RF signals), since a high power amplifier may not be optimized for low power amplification and a low power amplifier may not be optimized for high power amplification. The high power amplifier may be used in a high power mode to provide high power amplification of a signal. The low power amplifier may be used in a low power mode to provide low power amplification of a signal. Accordingly, certain aspects herein provide a switching architecture for selectively coupling an output (e.g., one or more antennas) to one of the high power amplifier and the low power amplifier. In certain aspects, the techniques discussed herein may further be extended to communication devices with more than two amplifiers. For example, a communication device may have additional amplifiers (e.g., a mid power amplifier) and additional modes of operation (e.g., a mid power mode).

Figure 4:
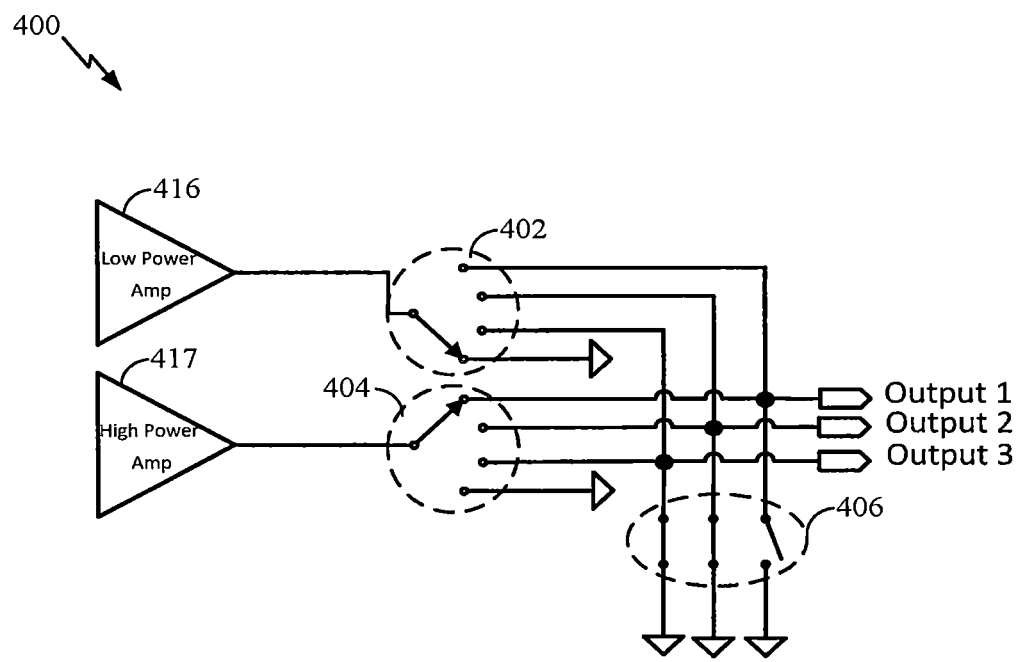
FIG. 4 illustrates a diagram of an example switching architecture for an amplification system, in accordance with certain aspects of the present disclosure.

FIG. 4 illustrates a diagram of an example switching architecture for an amplification system 400. As shown, the amplification system 400 includes a low power amplifier 416 and a high power amplifier 417. The amplification system 400 further includes three outputs (output 1, output 2, and output 3). In some aspects, the outputs include antennas. The amplification system 400 further includes a set of low power switches 402, a set of high power switches 404, and a set of shunt switches 406.

The low power switches 402 are configured to selectively couple the low power amplifier 416 to the outputs. In particular, the low power switches 402 may couple the low power amplifier 416 to one of the outputs at a time and decouple the low power amplifier 416 from the remaining outputs, or may decouple the low power amplifier 416 from all of the outputs. Further, the high power switches 404 are configured to selectively couple the high power amplifier 417 to the outputs. In particular, the high power switches 404 may couple the high power amplifier 417 to one of the outputs at a time and decouple the high power amplifier 417 from the remaining outputs, or may decouple the high power amplifier 417 from all of the outputs. In certain aspects, only one of the low power amplifier 416 and the high power amplifier 417 is coupled to an output at a time, and only one output is coupled to one of the low power amplifier 416 and the high power amplifier 417 at a time. Further, in certain aspects, only one of the low power amplifier 416 and the high power amplifier 417 (i.e., the one coupled to an output) is powered on (e.g., utilized for amplification) at a time. The other of the low power amplifier 416 and the high power amplifier 417 may be powered off (e.g., not utilized for amplification, such as, fully powered off, in a warmup state, etc.).

The shunt switches 406 may selectively couple the paths between the low power switches 402/high power switches 404 and the outputs to a reference potential (e.g., ground, reference voltage). In particular, as discussed above, in certain aspects, only one of the outputs (e.g., a selected output) may be coupled to one of the low power amplifier 416 or the high power amplifier 417 at a time (e.g., in a lower power amplification mode or a high power amplification mode, respectively). The shunt switch 406 associated with the output coupled to one of the low power amplifier 416 or the high power amplifier 417 may be open, so the signal from the low power amplifier 416 or high power amplifier 417 is properly applied to the output. The shunt switches 406 for the remaining outputs (e.g., unselected outputs) not coupled to either of the low power amplifier 416 or the high power amplifier 417 may be closed, coupling the outputs to the reference potential. In such a lower power amplification mode or a high power amplification mode, the closed shunt switches 406 provide port isolation of the selected output from the remaining unselected outputs. In particular, any power (e.g., from the low power amplifier 416 or the high power amplifier 417) at the unselected outputs from parasitic coupling (e.g., due to parasitics of the switches, through the device packaging, through interconnects, etc.) of the unselected outputs to the selected output, lower power amplifier 416, or high power amplifier 417 is shunted to the reference potential. Further, the closed shunt switches 406 of the unselected outputs can provide impedance control.

In certain aspects (e.g., in a no amplification mode), neither the low power amplifier 416 nor the high power amplifier 417 is coupled to any outputs. Accordingly, all the shunt switches 406 associated with each output may be closed, coupling the outputs to the reference potential. In such a no amplification mode, the closed shunt switches 406 provide isolation requirements for the outputs.

As seen in FIG. 4, the actual implementation of the switching architecture for the amplification system 400 is not shown. In particular, the implementation for the low power switches 402, high power switches 404, and shunt switches 406 is not shown. The implementation of the switching architecture may be subject to certain constraints and considerations. For example, the cost (e.g., silicon area) to implement the switches, the power loss of the switches, and the reliability of the switches may all be considered.

One factor in reliable switch design is avoiding exceeding the voltage limit of a single device. For example, a transistor may have a maximum voltage limit across the drain and source of the transistor when the transistor is off (e.g., essentially acting as an open switch to decouple an element coupled to the drain from an element coupled to the source). Accordingly, for a switch design, transistors may be coupled in series to divide the voltage between the transistors, so that the voltage limit at any single transistor is not exceeded.

Adding transistors to the switch to divide the voltage between, however, may increase the silicon area required to implement the switch.

Further, each transistor may have an associated resistance across the transistor when the transistor is on (e.g., essentially acting as a closed switch to couple an element coupled to the drain to an element coupled to the source). If multiple transistors are added in series for a switch, the resistance of each transistor adds to the overall resistance of the switch, thereby increasing the resistance of the switch. The increased resistance leads to greater power loss when the switch is closed. In order to maintain the resistance, and therefore power loss, when adding additional transistors in series, additional transistors may be added in parallel for the switch design, thus increasing the width of the switch design. Accordingly, the increase in silicon area for implementing a switch, while maintaining a constant resistance to maintain a minimum power loss is proportional to the square of the number of transistors in series included in the switch. Thus, reducing the number of transistors needed in a switching architecture is of importance. Accordingly, certain aspects of the present disclosure are directed to a switch architecture that reduces the number of transistors needed to switch between a high power amplifier and a low power amplifier. In particular, in certain aspects, the architecture may be changed such that the shunt switches are repurposed to act as both shunt switches and low-power switches.

Figure 5:
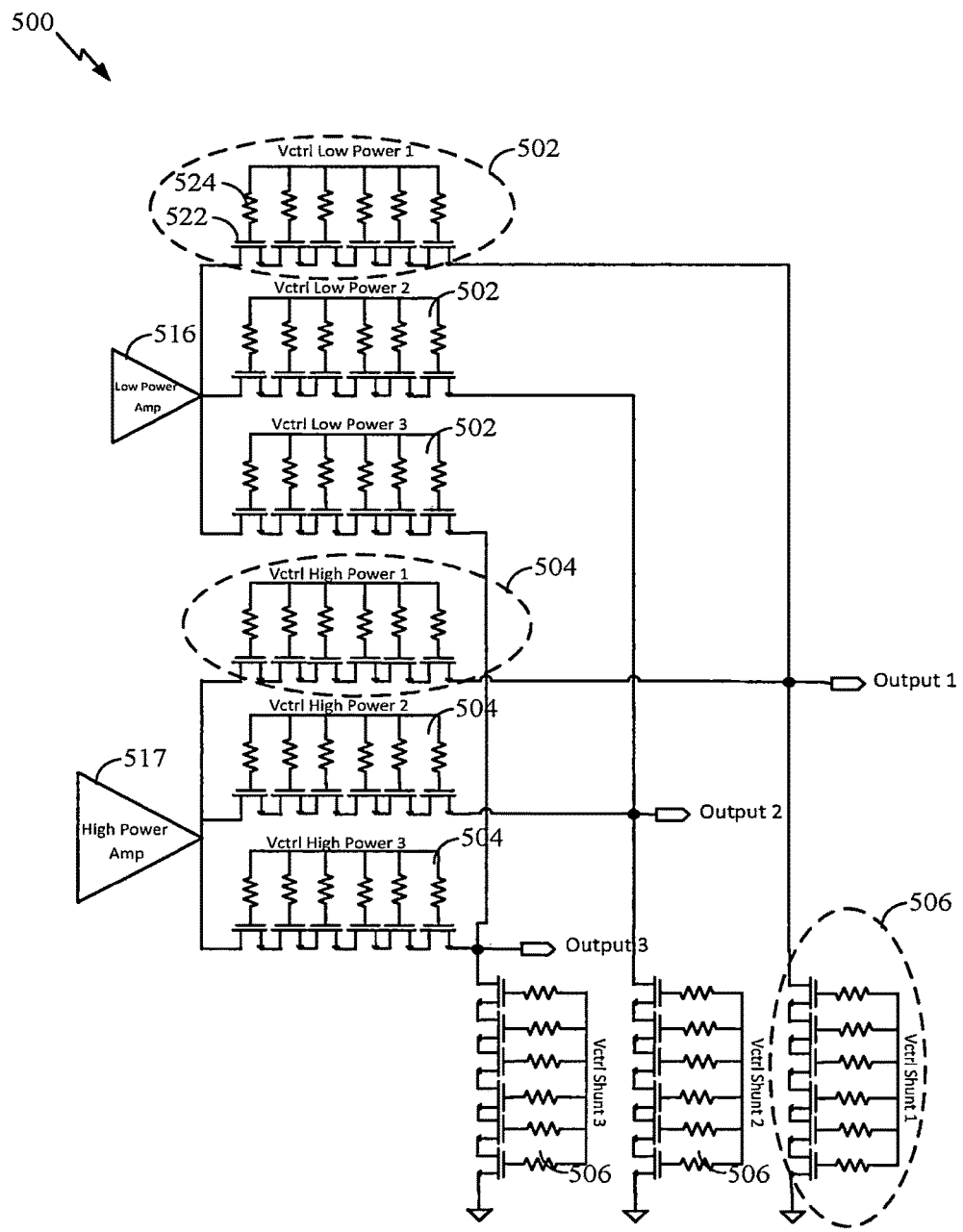
FIG. 5 illustrates a circuit diagram of an example switching architecture for an amplification system, in accordance with certain aspects of the present disclosure.

FIG. 5 illustrates a circuit diagram of an example switching architecture for an amplification system 500. As shown, the amplification system 500 includes a low power amplifier 516 and a high power amplifier 517. The amplification system 500 further includes three outputs (output 1, output 2, and output 3). In some aspects, the outputs include antennas. In some aspects, the outputs may include circuitry between the low power amplifier 516/high power amplifier 517 and the antennas, such as, a duplexor, a surface acoustic wave resonator, etc. The amplification system 500 further includes a set of low power switches 502, a set of high power switches 504, and a set of shunt switches 506. In particular, each output is coupled to one low power switch 502, one high power switch 504, and one shunt switch 506.

Each of the low power switches 502 is coupled between the low power amplifier 516 and an output. Further, each of the high power switches 504 is coupled between the high power amplifier 517 and an output. Each of the shunt switches 506 is coupled between the output and a reference potential (e.g., ground).

As shown, each of the switches 502/504/506 include a plurality of transistors 522 coupled in series. Further, the gate terminal of each transistor 522 for a given switch are coupled together. For example, as shown, each of the gate terminals are coupled to a resistor 524, which are coupled together for a given switch. The resistors may have a very high impedance compared to the parasitic capacitance between the source and gate, and drain and gate of the transistor 522. Accordingly, the resistance of the resistor 524 may be large enough such that the gate-source and gate-drain capacitance impedance of the transistor 522 is lower relative to the resistor impedance of the resistor 524. The lower capacitance impedance of the transistor 522 ensures that the gate potential of the transistor 522 tracks the drain and source voltage of the transistor 522 in order to minimize additional stress voltage at the drain-gate or source-gate terminals of the transistor 522. The gate potential of the transistor 522 remains proportional to the RF signal applied to the transistor 522 when the transistor 522 is on or off. In certain aspects, the resistor 524 provides the DC to the switch. Further, in certain aspects, the resistor 524 isolates the circuit providing the DC (e.g., logic to the transistor 522) from the RF signal. In some aspects, the resistors 524 are polysilicon resistors. In some aspects, a different high impedance element may be used in place of the resistors 524.

The gate terminals of each switch 502/504/506 may be coupled to a separate control signal (e.g., controllable bias voltage) (e.g., via the resistors 524). For example, the gate terminals of a low power switch 502 coupled to output 1 may be coupled to a control signal Vctrl Low Power 1 that selectively opens and closes the low power switch 502. Similarly, each of the remaining switches 502/504/506 are coupled to a separate control signal. As shown, the gate terminals of the low power switches 502 coupled to outputs 1-3 are coupled to control signals Vctrl Low Power 1-3, respectively. Further, the gate terminals of the high power switches 504 coupled to outputs 1-3 are coupled to control signals Vctrl High Power 1-3, respectively. The gate terminals of the shunt switches 506 coupled to outputs 1-3 are coupled to control signals Vctrl Shunt 1-3, respectively. In some aspects, the control signals may be generated by a baseband processor, or another appropriate processor (e.g., DAC 308, controller 280, controller 230, etc.). For example, the control signals may be generated based on register bits set by the baseband processor or another appropriate processor.

In the implementation shown in FIG. 5, each of the switches 502/504/506 includes the same number of transistors. In particular, each of the switches 502/504/506 may be potentially subject to the same high voltage signal from the high power amplifier 516 depending on the operation of the amplification system 500. For example, the amplification system 500 may have three modes of operation: a low power amplification mode, a high power amplification mode, and a no amplification mode. Further, in each of the low power amplification mode and the high power amplification mode, one of the outputs is selected to be coupled to either the low power amplifier 516 or the high power amplifier 517, respectively.

In the low power amplification mode, the low power amplifier 516 is powered on (e.g., utilized for amplification), the high power amplifier 517 is powered off (e.g., not utilized for amplification, such as, fully powered off, in a warmup state, etc.), and a signal amplified by the low power amplifier 516 is coupled to the selected output. In particular, in the low power amplification mode, the low power switch 502 associated with the selected output is closed, and the high power switch 504 and the shunt switch 506 associated with the selected output are open. For example, the Vctrl Low Power control signal of the selected output may be asserted, while the Vctrl High Power control signal and Vctrl Shunt control signal of the selected output are not asserted. Accordingly, the low power switch 502 of the selected output is closed, so there is no voltage across the drain and source to stress the transistors of the low power switch 502 of the selected output. Further, the high power switch 504 of the selected output is open, so the high power switch 504 of the selected output may experience the full low voltage potential from the low power amplifier 516. Further, the shunt switch 506 is open, so the shunt switch 506 of the selected output may experience the full low voltage potential from the low power amplifier 516 (e.g., between the low power amplifier 516 and ground). Though the high power switches 504 and the shunt switches 506 (for when their associated output is selected) experience only the low voltage potential from the low power amplifier 516 and not the high voltage potential from the high power amplifier 517 in the low power amplification mode, each of the high power switches 504 and shunt switches 506 may still be designed (i.e., at time of design of the amplification system 500) to have sufficient transistors to handle the full high voltage potential from the high power amplifier 517 (e.g., between the high power amplifier 517 and ground) due to other modes of operation of the amplification system 500.

In the low power amplification mode, for the remaining unselected outputs, the associated low power switches 502 and high power switches 504 are open, and the associated shunt switches 506 are closed. For example, the Vctrl Low Power control signals and Vctrl High Power control signals of the unselected outputs may not be asserted, while the Vctrl Shunt control signals of the unselected outputs are asserted. Accordingly, the low power switches 502 associated with the unselected outputs may experience only the full low voltage potential from the low power amplifier 516 (e.g., between the low power amplifier and ground) and not a full high voltage potential from the high power amplifier 517 (e.g., between the high power amplifier and ground). However, each of the low power switches 502 may still be designed (i.e., at time of design of the amplification system 500) to have sufficient transistors to handle the full high voltage potential from the high power amplifier 517 due to other modes of operation of the amplification system 500. The high power switches 504 may be shielded from the full low voltage potential due to the low power switches 502 being open. Further the shunt switches 506 are closed, so there is no voltage across the drain and source to stress the transistors of the shunt switches 506 of the unselected outputs.

In the high power amplification mode, the low power amplifier 516 is powered off (e.g., not utilized for amplification, such as, fully powered off, in a warmup state, etc.), the high power amplifier 517 is powered on (e.g., utilized for amplification), and a signal amplified by the high power amplifier 517 is coupled to the selected output. In particular, in the high power amplification mode, the high power switch 504 associated with the selected output is closed, and the low power switch 502 and the shunt switch 506 of the selected output are open. For example, the Vctrl High Power control signal of the selected output may be asserted, while the Vctrl Low Power control signal and Vctrl Shunt control signal of the selected output are not asserted. Accordingly, the high power switch 504 of the selected output is closed, so there is no voltage across the drain and source to stress the transistors of the high power switch 504. Further, the low power switch 502 of the selected output is open, and since the low power switch 502 is coupled to the selected output, and the selected output is coupled to the signal from the high power amplifier 517, the low power switch 502 of the selected output may experience the full high voltage potential from the high power amplifier 517 (e.g., between the high power amplifier and ground). Therefore, each of the low power switches 502 is designed (i.e., at time of design of the amplification system 500) to have sufficient transistors to handle the full high voltage potential from the high power amplifier 517 (for when their associated output is selected). Similarly, the shunt switch 506 of the selected output is open and coupled to the selected output, and therefore may experience the full high voltage potential from the high power amplifier 517. Therefore, each of the shunt switches 506 is designed (i.e., at time of design of the amplification system 500) to have sufficient transistors to handle the full high voltage potential from the high power amplifier 517.

In the high power amplification mode, for the remaining unselected outputs, the associated low power switches 502 and high power switches 504 are open, and the associated shunt switches 506 are closed. For example, the Vctrl Low Power control signals and Vctrl High Power control signals of the unselected outputs may not be asserted, while the Vctrl Shunt control signals of the unselected outputs are asserted. Accordingly, the high power switches 504 associated with the unselected outputs may experience the full high voltage potential from the high power amplifier 517. Therefore, the number of transistors used for each of the high power switches 504 may be selected according to the potential full high voltage output from the high power amplifier 517 (e.g., between the high power amplifier and ground). Accordingly, all of the switches 502, 504, and 506 are designed (i.e., at time of design of the amplification system 500) to handle the output from the high power amplifier 517, requiring more transistors for each switch and therefore more silicon area for implementation. The low power switches 502 may be shielded from the full high voltage potential due to the high power switches 504 being open. Further, the shunt switches 506 are closed, so there is no voltage across the drain and source to stress the transistors of the shunt switches 506 of the unselected outputs.

In the no amplification mode, the low power amplifier 516 and high power amplifier 517 are powered off (e.g., not utilized for amplification, such as, fully powered off, in a warmup state, etc.), and the outputs are decoupled from the low power amplifier 516 and the high power amplifier 517. In particular, in the no amplification mode, the low power switches 502 and high power switches 504 are open to decouple all the outputs from the low power amplifier 516 and the high power amplifier 517. Further, the shunt switches 506 are closed to improve isolation or impedance control of the unused path to all of the outputs. For example, the Vctrl Shunt control signal of each of the outputs may be asserted, while the Vctrl High Power control signal and Vctrl Low Power control signal are not asserted.

Accordingly, certain aspects of the present disclosure are directed to a switch architecture that reduces the number of transistors needed to switch between a high power amplifier and a low power amplifier. In particular, in certain aspects, the architecture may be changed such that the shunt switches are repurposed to act as both shunt switches and low-power switches.

Figure 6:
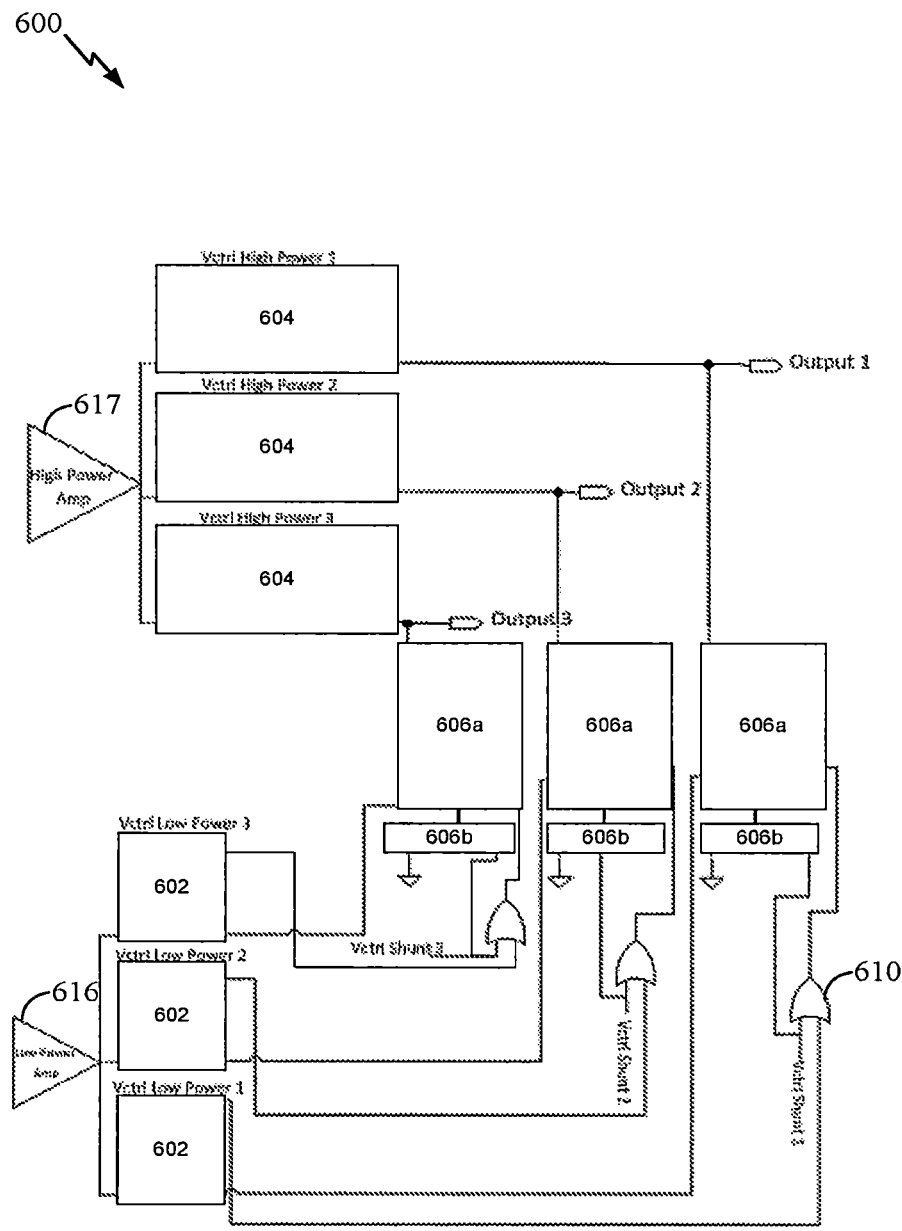
FIG. 6 illustrates a diagram of an example switching architecture for an amplification system, in accordance with certain aspects of the present disclosure.

FIG. 6 illustrates a diagram of an example switching architecture for an amplification system 600. As shown, the amplification system 600 includes a low power amplifier 616 and a high power amplifier 617. The amplification system 600 further includes three outputs (output 1, output 2, and output 3). In some aspects, the outputs include antennas. In some aspects, the outputs may include circuitry between the low power amplifier 616/high power amplifier 617 and the antennas, such as, a duplexor, a surface acoustic wave resonator, etc. The amplification system 600 further includes a set of low power switches 602, a set of high power switches 604, and a set of shunt switches 606. In particular, each output is coupled to one low power switch 602, one high power switch 604, and one shunt switch 606. In some aspects, the amplification system 600 may include fewer or more outputs, each with corresponding switches 602, 604, and 606.

In some aspects, the shunt switches 606 serve a dual purpose and can act as both shunt switches and as low power switches. In particular, the shunt switches 606 are configured to selectively shunt the output to a reference potential (e.g., ground), reduce a potential applied to the low power switches 602, or couple the low power amplifier 616 to the outputs. Accordingly, since the shunt switches 606 reduce the voltage potential applied to the low power switches 602, in some aspects, each of the low power switches 602 includes fewer transistors than the high power switches 604 or the shunt switches 606 as discussed herein. Thus, the silicon area used to implement the amplification system 600 may be reduced as compared to the silicon area used to implement an amplification system 500, for example.

In some aspects, each of the low power switches 602, high power switches 604, and shunt switches 606 may include one or more transistors coupled in series. Further, in certain aspects, each of the shunt switches 606 includes two portions, a first portion 606a and a second portion 606b. Each of the portions may correspond to one or more transistors of the shunt switches 606.

Each of the low power switches 602 is coupled between the low power amplifier 616 and the first portions 606a of the shunt switches 606. Further, each of the high power switches 604 is coupled between the high power amplifier 617 and an output. Each of the first portions 606a of the shunt switches 606 is coupled between the output and the low power switches 602. Each of the first portions 606a of the shunt switches 606 is also coupled between the output and the second portions 606b of the shunt switches 606. Further, each of the second portions 606b of the shunt switches 606 is coupled between the first portions of the shunt switches 606a and a reference potential (e.g., ground). Accordingly, the path between the low power amplifier 616 and an output passes through both a low power switch 602 and a first portion 606a of a shunt switch 606. Further, the path between the output and ground for impedance control or isolation of an output passes through both the first portion 606a and second portion 606b of a shunt switch 606.

Each of the low power switches 602, high power switches 604, and shunt switches 606 may be coupled to a separate control signal (e.g., controllable bias voltage). The control signals control whether the switch is open or closed. For example, in some aspects, each of the gate terminals of transistors of the switches 602/604/606 may be coupled to a separate control signal.

In some aspects, the low power switch 602 coupled to output 1 may be coupled to a control signal Vctrl Low Power 1 that selectively opens and closes the low power switch 602. Similarly, each of the remaining switches 602/604/606 are coupled to a separate control signal. As shown low power switches 602 coupled to outputs 1-3 are coupled to control signals Vctrl Low Power 1-3, respectively. Further, the high power switches 604 coupled to outputs 1-3 are coupled to control signals Vctrl High Power 1-3, respectively. The different portions 606a and 606b of the shunt switches 606 are coupled to different control signals. In particular, the second portion 606b of the shunt switches 606 coupled to outputs 1-3 are coupled to control signals Vctrl Shunt 1-3, respectively. The first portion 606a of the shunt switches 606 coupled to outputs 1-3 are coupled to both control signals Vctrl Shunt 1-3 and Vctrl Low Power 1-3, respectively. In some aspects, the first portion 606a may be coupled to both control signals by an OR gate 610. For example, the first portion 606a coupled to output 1 is coupled to both control signal Vctrl Shunt 1 and Vctrl Low Power 1. Accordingly, the first portion 606a may be open or closed by either of Vctrl Shunt 1 and Vctrl Low Power 1.

In some aspects, the control signals may be generated by a baseband processor, or another appropriate processor (e.g., DAC 308, controller 280, controller 230, etc.). For example, the control signals may be generated based on register bits set by the baseband processor or another appropriate processor.

The amplification system 600 may have three modes of operation: a low power amplification mode, a high power amplification mode, and a no amplification mode. Further, in each of the low power amplification mode and the high power amplification mode, one of the outputs is selected to be coupled to either the low power amplifier 616 or the high power amplifier 617, respectively.

In the low power amplification mode, the low power amplifier 616 is powered on (e.g., utilized for amplification), the high power amplifier 617 is powered off (e.g., not utilized for amplification, such as, fully powered off, in a warmup state, etc.), and a signal amplified by the low power amplifier 616 is coupled to the selected output. In particular, in the low power amplification mode, the low power switch 602 associated with the selected output is closed, the first portion 606a of the shunt switch 606 of the selected output is closed, the high power switch 604 of the selected output is open and the second portion 606b of the shunt switch 606 of the selected output is open. For example, the Vctrl Low Power control signal of the selected output may be asserted, while the Vctrl High Power control signal and Vctrl Shunt control signal of the selected output are not asserted. Accordingly, the low power switch 602 and first portion 606a of the selected output are closed, so there is no voltage across the drain and source to stress the transistors of the low power switch 602 or the first portion 606a of the selected output. Further, the high power switch 604 of the selected output is open, so the high power switch 604 of the selected output may experience the full low voltage potential from the low power amplifier 616 (e.g., between the low power amplifier and ground). Further, the second portion 606b of the shunt switch 606 of the selected output is open, so the second portion 606b of the selected output may experience the full low voltage potential from the low power amplifier 616. Accordingly, each of the second portions 606b of the shunt switches 606 may include sufficient transistors to handle the full low voltage potential from the low power amplifier 616 (for when their associated output is selected). Further, though each of the high power switches 604 (for when their associated output is selected) experience only the low voltage potential from the low power amplifier 616 and not the high voltage potential from the high power amplifier 617 in the low power amplification mode, each of the high power switches 604 may still be designed (i.e., at time of design of the amplification system 600) to have sufficient transistors to handle the full high voltage potential from the high power amplifier 617 (e.g., between the high power amplifier and ground) due to other modes of operation of the amplification system 600.

In the low power amplification mode, for the remaining unselected outputs, the associated low power switches 602 and high power switches 604 are open, and the associated shunt switches 606 (including the first portions 606a and second portions 606b) are closed. For example, the Vctrl Low Power control signals and Vctrl High Power control signals of the unselected outputs may not be asserted, while the Vctrl Shunt control signals of the unselected outputs are asserted. Accordingly, the low power switches 602 associated with the unselected outputs may experience only the full low voltage potential from the low power amplifier 616 and not a full high voltage potential from the high power amplifier 617. Therefore, each of the low power switches 602 may include sufficient transistors to handle the full low voltage potential from the low power amplifier 616 (e.g., between the low power amplifier and ground). The high power switches 604 may be shielded from the full low voltage potential due to the low power switches 602 being open, and the shunt switches 606 are closed, so there is no voltage across the drain and source to stress the transistors of the shunt switches 606 of the unselected outputs.

In the high power amplification mode, the low power amplifier 616 is powered off (e.g., not utilized for amplification, such as, fully powered off, in a warmup state, etc.), the high power amplifier 617 is powered on (e.g., utilized for amplification), and a signal amplified by the high power amplifier 617 is coupled to the selected output. In particular, in the high power amplification mode, the high power switch 604 associated with the selected output is closed, and the low power switch 602 and the first and second portions 606a and 606b of the shunt switch 606 of the selected output are open. For example, the Vctrl High Power control signal of the selected output may be asserted, while the Vctrl Low Power control signal and Vctrl Shunt control signal of the selected output are not asserted. Accordingly, the high power switch 604 of the selected output is closed, so there is no voltage across the drain and source to stress the transistors of the high power switch 604. Further, the low power switch 602 of the selected output is open. Unlike the amplification system 500, however, the low power switch 602 of the selected output does not experience the full high voltage potential from the high power amplifier 617. In particular, the first portion 606a of the shunt switch 606 of the selected output is coupled between the low power switch 602 of the selected output and the output of the high power amplifier 617. The first portion 606a of the selected output divides some of the voltage potential from the high power amplifier 617. Accordingly, the low power switch 602 of the selected output experiences a reduced voltage potential, not the full voltage potential from the high power amplifier 617, and can be formed of fewer transistors in series. Each of the first portions 606a may include sufficient transistors that when combined with the transistors of the corresponding low power switch 602, can handle the full high voltage potential from the high power amplifier 617 (for when their associated output is selected). The combined first portion 606a and second portion 606b of the shunt switch 606 of the selected output are open and coupled to the selected output, and therefore may experience the full high voltage potential from the high power amplifier 617. Therefore, each of the shunt switches 606 as a whole, including both the first portions 606a and the second portions 606b, includes sufficient transistors to handle the full high voltage potential from the high power amplifier 617 (e.g., between the high power amplifier and ground) (for when their associated output is selected). In some aspects, each of the second portions 606b and the respective low power switch 602 may include the same number of transistors. In some aspects, each of the high power switches 604 may include the same number of transistors as the combination of the respective first portion 606a and second portion 606b.

In the high power amplification mode, for the remaining unselected outputs, the associated low power switches 602 and high power switches 604 are open, and the associated shunt switches 606 (including the first portions 606a and second portions 606b) are closed. For example, the Vctrl Low Power control signals and Vctrl High Power control signals of the unselected outputs may not be asserted, while the Vctrl Shunt control signals of the unselected outputs are asserted. Accordingly, the high power switches 604 associated with the unselected outputs may experience the full high voltage potential from the high power amplifier 617 (e.g., between the high power amplifier and ground). Therefore, the number of transistors used for each of the high power switches 604 may be selected (i.e., at design time) according to the potential full high voltage output from the high power amplifier 617. The low power switches 602 may be shielded from the full high voltage potential due to the high power switches 604 being open, and the shunt switches 606 are closed, so there is no voltage across the drain and source to stress the transistors of the shunt switches 606 of the unselected outputs.

In the no amplification mode, the low power amplifier 616 and high power amplifier 617 are powered off (e.g., not utilized for amplification, such as, fully powered off, in a warmup state, etc.), and the outputs are decoupled from the low power amplifier 616 and the high power amplifier 617. In particular, in the no amplification mode, the low power switches 602 and high power switches 604 are open to decouple the output from the low power amplifier 616 and the high power amplifier 617. Further, the first portions 606a and seconds portion 606b of the shunt switch 606es are closed to improve isolation or impedance control of the unused path to the outputs. For example, the Vctrl Shunt control signal of each of the outputs may be asserted, while the Vctrl High Power control signal and Vctrl Low Power control signal are not asserted.

Accordingly, as discussed, the amplification system 600 may utilize fewer transistors to implement a switching architecture due to the design of the amplification system 600 as compared to the amplification system 500.

In certain aspects, an amplification system similar to amplification system 600 may have more than two amplifiers (e.g., more than a low power amplifier and a high power amplifier) and more than three modes of operation. For example, the amplification system may have any number of additional amplifiers (e.g., a mid power amplifier) and a corresponding number of modes of operation (e.g., a mid power amplification mode). In certain aspects, such an amplification system may still have only one or no amplifier turned on (e.g., utilized for amplification) at a given time, and further have only one or no output connected to an amplifier at a given time. In certain such aspects, the shunt switches of the amplification system may be segmented into as many sub portions as there are amplifiers in the amplification system. Further, each of the amplifiers, depending on the power level, can couple between a different one of the portions of the shunt switches. For example, amplifiers of a lower power may couple at a point in the shunt switch that is closer to the reference, and amplifiers of a higher power may couple at a point in the shunt switch that is closer to the output. Each portion may be coupled (e.g., by an OR gate) a control signal of the shunt switch (e.g., Vctrl Shunt) and a control signal of one of the amplifiers (e.g., Vctrl High Power, Vctrl Mid Power, Vctrl Low Power, etc.). The number of transistors in each portion may be based on the power level of the amplifiers in the amplification system. In certain aspects, the number of transistors of each shunt switch overall (including each portion), may still be based on the full high voltage potential of the highest power amplifier and equal to the number of transistors used for each of the highest power switches coupled between the highest power amplifier and the output. Further, in certain aspects, the total number of transistors in series between any amplifier and an output may be the same for each amplifier.

Figure 7:
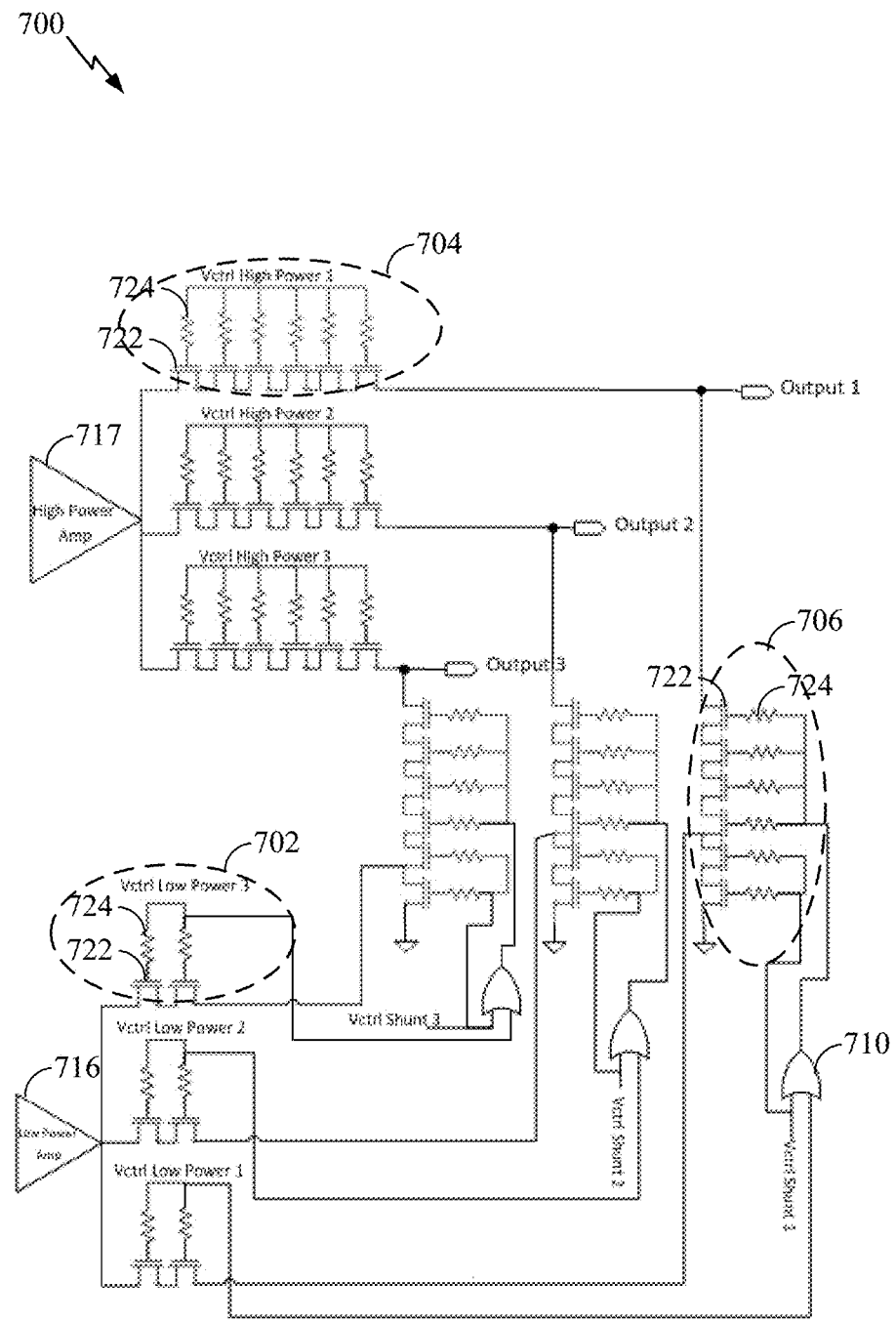
FIG. 7 illustrates a circuit diagram of an example implementation of a switching architecture for an amplification system, in accordance with certain aspects of the present disclosure.

FIG. 7 illustrates a circuit diagram of an example implementation of a switching architecture for an amplification system 700. In some aspects, the amplification system 700 is an implementation of the amplification system 600.

As shown, the amplification system 700 includes a low power amplifier 716 and a high power amplifier 717. The amplification system 700 further includes three outputs (output 1, output 2, and output 3). In some aspects, the outputs include antennas. In some aspects, the outputs may include circuitry between the low power amplifier 716/high power amplifier 717 and the antennas, such as, a duplexor, a surface acoustic wave resonator, etc. The amplification system 700 further includes a set of low power switches 702, a set of high power switches 704, and a set of shunt switches 706. In particular, each output is coupled to one low power switch 702, one high power switch 704, and one shunt switch 706. In some aspects, the amplification system 700 may include fewer or more outputs, each with corresponding switches 702, 704, and 706.

In particular, the low power amplifier 716 and high power amplifier 717 correspond to the low power amplifier 616 and high power amplifier 617 described with respect to amplification system 600. Further, the set of low power switches 702, a set of high power switches 704, and a set of shunt switches 706 correspond to the set of low power switches 602, a set of high power switches 604, and a set of shunt switches 606 described with respect to amplification system 600. In addition, the OR gates 710 correspond to the OR gates 610 described with respect to amplification system 600. Each of these elements may perform the same functions as the corresponding elements described with respect to amplification system 600.

In the implementation shown of amplification system 700, each of the low power switches 702, high power switches 704, and shunt switches 706 may include one or more transistors 722 coupled in series. In particular, the low power switches 702 each include two transistors 722. Further, the high power switches 704 each include six transistors 722. The shunt switches 706 each include six transistors 722. Accordingly, the low power switches 702 each include fewer transistors coupled in series than the high power switches 704 and the shunt switches 706.

The transistors 722 of the high power switches 704 are coupled in series between the high power amplifier 717 and the outputs. The transistors 722 of the shunt switches 706 are coupled in series between the outputs and a reference potential (e.g., ground). Further, the transistors 722 of the low power switches 702 are coupled in series between the low power amplifier 716 and nodes between the transistors 722 of the shunt switches 706. In particular, the nodes may be located between the transistors of the shunt switches 706 corresponding to the first portion 606a and the second portion 606b of the shunt switches 606 described with respect to amplification system 600.

As shown, the gate terminals of different transistors 722 of the shunt switches 706 are coupled to different control signals. In particular, the gate terminals of two transistors of each of the shunt switches 706 coupled to outputs 1-3 are coupled to the control signals Vctrl Shunt 1-3 only, respectively. These two transistors correspond to the second portion 606b of shunt switches 606 described with respect to amplification system 600. Further, the gate terminals of four transistors of each of the shunt switches 706 coupled to outputs 1-3 are coupled to the control signals Vctrl Shunt 1-3 and Vctrl Low Power 1-3, respectively (e.g., via OR gates 710). These four transistors correspond to the first portion 606a of shunt switches 606 described with respect to amplification system 600. Further, the gate terminals of the transistors 722 of the high power switches 704 coupled to outputs 1-3 are coupled to the control signals Vctrl High Power 1-3, respectively. In addition, the gate terminals of the transistors 722 of the high power switches 704 coupled to outputs 1-3 are coupled to the control signals Vctrl High Power 1-3, respectively.

As discussed with respect to amplification system 600, in some aspects, the control signals may be generated by a baseband processor, or another appropriate processor (e.g., DAC 308, controller 280, controller 230, etc.). For example, the control signals may be generated based on register bits set by the baseband processor or another appropriate processor. In some aspects, the control signals may control the amplification system 700 to provide three different modes of operation (i.e., low power amplification mode, high power amplification mode, and no amplification mode) for the amplification system 700, as discussed with respect to amplification system 600. In some aspects, the amplification system 700 may include additional amplifiers and the control signal may control the amplification system 700 to provide additional modes of operation as discussed.

As shown, in some aspects, the gate terminals of each transistor 722 for a given switch are coupled to the respective control signal via a resistor 724 coupled to the gate terminal of each transistor 722. The resistors 722 may have a very high impedance compared to the parasitic capacitance between the source and gate, and drain and gate of the transistors 722. Accordingly, the resistance of the resistor 724 may be large enough such that the gate-source and gate-drain capacitance impedance of the transistor 722 is lower relative to the resistor impedance of the resistor 724. The lower capacitance impedance of the transistor 722 ensures that the gate potential of the transistor 722 tracks the drain and source voltage of the transistor 722 in order to minimize additional stress voltage at the drain-gate or source-gate terminals of the transistor 722. The gate potential of the transistor 722 remains proportional to the RF signal applied to the transistor 722 when the transistor 722 is on or off. In certain aspects, the resistor 724 provides the DC to the switch. Further, in certain aspects, the resistor 724 isolates the circuit providing the DC (e.g., logic to the transistor 722) from the RF signal. In some aspects, the resistors 724 are polysilicon resistors. In some aspects, a different high impedance element may be used in place of the resistors 724.

Figure 8:
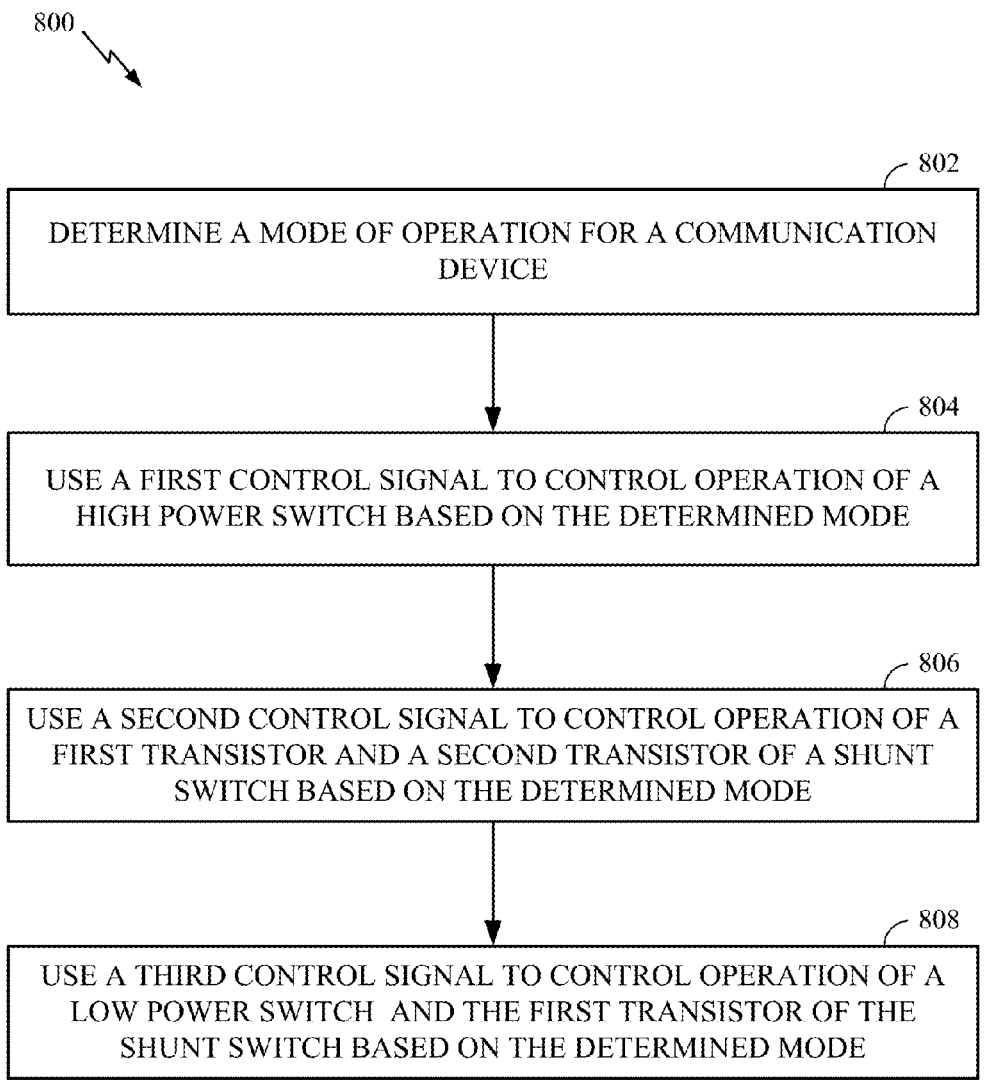
FIG. 8 is a flow diagram of example operations for operating a switching architecture for an amplification system, in accordance with certain aspects of the present disclosure.

FIG. 8 is a flow diagram of example operations 800 for operating a switching architecture for an amplification system, in accordance with certain aspects of the present disclosure. The operations 800 may be performed by a baseband processor, or another appropriate processor (e.g., DAC 308, controller 280, controller 230, etc.), in a device including an amplification system. For example, the control signals may be generated based on register bits set by the baseband processor or another appropriate processor.

The operations 800 may begin, at block 802, where it is determined what mode of operation (e.g., high amplification mode, low amplification mode, or no amplification mode) to use for a communication device. For example, a baseband processor of a communication device may determine whether one selected output should receive a signal amplified by a high power amplifier or a low power amplifier, while any other outputs (if any) receive no signal, or all outputs should receive no signal and select the corresponding mode of operation. The choice of operation mode may be based on a signal-to-noise ratio, beamforming operation, type of data to be transmitted, etc.

At block 804, a first control signal is used to control a high power switch coupled between the high power amplifier and an output. For example, the baseband processor may apply a different first control signal (e.g., directly or indirectly) to each high power switch of each output based on the determined mode of operation. In particular, the baseband processor may be coupled (e.g., directly or indirectly) to the gate terminals of the transistors of the high power switch via a high power control path and apply the first control signal to the gate terminals.

At block 806, a second control signal is used to control a shunt switch coupled between the output and a reference potential. For example, the baseband processor may apply a different second control signal (e.g., directly or indirectly) to each shunt switch of each output based on the determined mode of operation. In particular, the baseband processor may be coupled (e.g., directly or indirectly) to the gate terminals of the transistors of the shunt switch via a shunt control path and apply the second control signal to the gate terminals. In some aspects, the baseband processor may apply the second control signal to a first set of transistors of the shunt switch coupled between the output and a second set of transistors of the shunt switch and also coupled between the low power amplifier and the output. The baseband processor may also apply the second control signal to the second set of transistors coupled between the first set of transistors and the reference potential.

At block 808, a third control signal is used to control a low power switch coupled between the low power amplifier and the output and to the first set of transistors of the shunt switch coupled between the low power switches and the output. For example, the baseband processor may apply a different third control signal (e.g., directly or indirectly) to each low power switch and first set of transistors of the shunt switch of each output based on the determined mode of operation. In particular, the baseband processor may be coupled (e.g., directly or indirectly) to the gate terminals of the transistors of the low power switch and the first set of transistors of the shunt switch via a low power control path and apply the third control signal to the gate terminals.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for applying may comprise a baseband processor, or another appropriate processor (e.g., DAC 308, controller 280, controller 230, etc.) in a device including an amplification system.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An amplification system comprising:
a high power amplifier;
a low power amplifier;
a first switch coupled between the high power amplifier and an output;
a second switch having a first portion and a second portion, the first portion and the second portion being coupled in series between the output and a reference potential, wherein the first portion is further coupled between the low power amplifier and the output and configured to selectively couple the low power amplifier to the output; and
a third switch coupled between the low power amplifier and the first portion of the second switch, wherein a path between the low power amplifier and the output does not include the second portion of the second switch.

2. The amplification system of claim 1, wherein the first switch comprises a first plurality of transistors, the second switch comprises a second plurality of transistors, and the third switch comprises one or more transistors, wherein a number of the one or more transistors of the third switch are less than a number of the first plurality of transistors.

3. The amplification system of claim 1, wherein the first portion of the second switch comprises a first transistor and the second portion of the second switch comprises a second transistor, wherein the first transistor is coupled between the output and the third switch and the second transistor is coupled between the first transistor and the reference potential.

4. The amplification system of claim 3, wherein in a low power amplification mode the first switch is open, the third switch closed, the first transistor is turned on, and the second transistor is turned off.

5. The amplification system of claim 3, wherein in a high power amplification mode the first switch is closed, the third switch is open, the first transistor is turned off, and the second transistor is turned off.

6. The amplification system of claim 3, wherein in a no amplification mode the first switch is open, the third switch is open, the first transistor is turned on, and the second transistor is turned on.

7. The amplification system of claim 3, wherein a gate terminal of the first transistor is coupled to a first control signal and a second control signal, wherein the first control signal is further coupled to a gate terminal of the third switch and the second control signal is further coupled to a gate terminal of the second transistor.

8. The amplification system of claim 7, wherein the gate of the first transistor is coupled to the first control signal and the second control signal via a logic OR gate.

9. The amplification system of claim 1, wherein the second switch is configured to selectively shunt the output to the reference potential, reduce a potential applied to the third switch, or couple the low power amplifier to the output.

10. The amplification system of claim 1, wherein a number of transistors in the first switch between the high power amplifier and the output is equal to a number of transistors in the second switch and the third switch between the low power amplifier and the output.

11. An amplification system comprising:
a high power amplifier;
a low power amplifier;
a first transistor coupled between the high power amplifier and an output;
a second transistor;
a third transistor, wherein the second transistor is coupled between the output and the third transistor, and wherein the third transistor is coupled between the second transistor and a reference potential, the second transistor being directly coupled to the third transistor in series between the output and the reference potential; and
a fourth transistor coupled between the low power amplifier and a node between the second transistor and the third transistor, the fourth transistor being directly coupled to the node.

12. The amplification system of claim 11, wherein a gate terminal of the first transistor is coupled to a first control signal, a gate terminal of the third transistor is coupled to a second control signal, a gate terminal of the fourth transistor is coupled to a third control signal, and a gate terminal of the second transistor is coupled to the second control signal and the third control signal.

13. The amplification system of claim 11, further comprising one or more transistors coupled in series between the first transistor and the output, wherein a number of transistors between the high power amplifier and the output is equal to a number of transistors between the low power amplifier and the output.

14. A method of selectively coupling an output to a high power amplifier and a low power amplifier, the method comprising:
using a first control signal to control operation of a first transistor, the first transistor being coupled between the high power amplifier and the output;
using a second control signal and a third control signal to control operation of a second transistor;
using the second control signal to control operation of a third transistor, the second transistor being coupled in series between the output and the third transistor, and the third transistor being coupled between the second transistor and a reference potential; and
using the third control signal to control operation of a fourth transistor, the fourth transistor being coupled between the low power amplifier and a node between the second transistor and the third transistor,
further comprising controlling, in a low power amplification mode, the first transistor to be turned off, the fourth switch to be turned on, the second transistor to be turned on, and the third transistor to be turned off; or
further comprising controlling, in a high power amplification mode, the first transistor to be turned on, the fourth transistor to be turned off, the second transistor to be turned off, and the third transistor to be turned off; or
further comprising controlling, in a no amplification mode, the first transistor to be turned off, the fourth transistor to be turned off, the second transistor to be turned on, and the third transistor to be turned on.

15. The method of claim 14, wherein a number of transistors between the high power amplifier and the output is equal to a number of transistors between the low power amplifier and the output.

* * * * *